US011336000B2

(12) United States Patent
Zhu et al.

(10) Patent No.: US 11,336,000 B2
(45) Date of Patent: May 17, 2022

(54) FILTER ANTENNA

(71) Applicant: AAC Technologies Pte. Ltd., Singapore (SG)

(72) Inventors: Zhimin Zhu, Shenzhen (CN); Jianchun Mai, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 276 days.

(21) Appl. No.: 16/706,878

(22) Filed: Dec. 9, 2019

(65) Prior Publication Data

US 2020/0212552 A1 Jul. 2, 2020

(30) Foreign Application Priority Data

Dec. 31, 2018 (CN) ......................... 201811650599.8

(51) Int. Cl.
*H03M 1/38* (2006.01)
*H01Q 1/38* (2006.01)
*H01P 7/04* (2006.01)

(52) U.S. Cl.
CPC ................................... *H01Q 1/38* (2013.01); *H01P 7/04* (2013.01)

(58) Field of Classification Search
CPC ................................... H01Q 1/38; H01P 7/04
USPC .......................................................... 343/702
See application file for complete search history.

(56) References Cited

U.S. PATENT DOCUMENTS 8,860,532 B2 10/2014 Gong
8,872,704 B2 * 10/2014 Chung ................. H01Q 9/0457 343/700 MS
2020/0212531 A1 * 7/2020 Mai ..................... H01P 1/20318

FOREIGN PATENT DOCUMENTS

CN 104638360 B2 5/2015
CN 108832291 B2 11/2018
CN 109818142 A1 5/2019

OTHER PUBLICATIONS

PCT search report dated Feb. 3, 2020 by SIPO in related PCT Patent Application No. PCT/CN2019/113371 (4 Pages).
1st Office Action dated Mar. 19, 2020 by SIPO in related Chinese Patent Application No. 201811650599.8 (7 Pages).

* cited by examiner

*Primary Examiner* — Peguy Jean Pierre
(74) *Attorney, Agent, or Firm* — W&G Law Group

(57) ABSTRACT

The present invention provides a filter antenna including a first resonant cavity and a second resonant cavity which are stacked from top to bottom and in coupling communication with each other, an antenna unit provided on a side of the first resonant cavity facing away from the second resonant cavity, and a feed structure provided in the second resonant cavity. The present invention integrates a filter with an antenna to ensure the performance of the filter antenna by using a SIW cavity filter, thereby effectively suppressing interference from out-of-band spurious signals. In addition, the stacking structure of the antenna and the filter effectively reduces a volume to achieve miniaturization, and the antenna structure is optimized in a compact environment.

7 Claims, 5 Drawing Sheets

FILTER ANTENNA

TECHNICAL FIELD

The present invention relates to the field of microwave communication, and in particular, to a filter antenna device used in the field of communication electronic products.

BACKGROUND

As 5G becomes the focus of research and development in the global industry, developing 5G technologies and formulating 5G standards have become an industry consensus. The characteristics of high carrier frequency and large bandwidth unique to the millimeter wave are the main solutions to achieve a 5G ultra-high data transmission rate. The rich bandwidth resources of the millimeter wave band provide a guarantee for a high-speed transmission rate. However, due to the severe spatial loss of electromagnetic waves in this frequency band, wireless communication systems using the millimeter wave band need to adopt a phased array architecture. The phases of respective array elements are distributed according to certain regularity by a phase shifter, so that a high gain beam is formed and the beam scans over a certain spatial range through a change in phase shift. It is inevitable for an antenna and a filter, as indispensable components in a radio frequency (RF) front-end system, to develop towards a direction of integration and miniaturization while taking into account an antenna performance, so how to achieve a miniaturized structural design while ensuring the antenna performance is a difficult problem in current research and development of antenna technology.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

Figure 1:
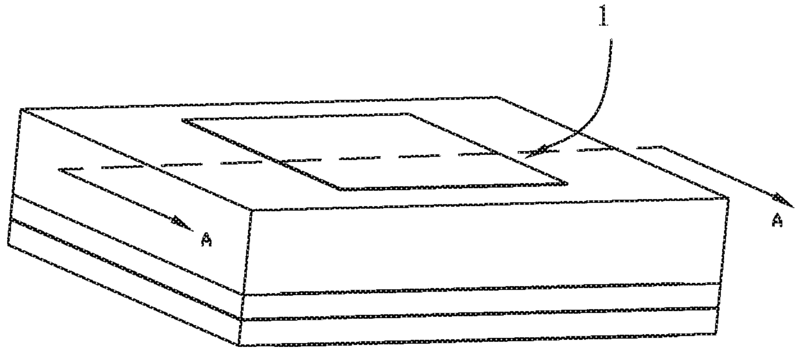
FIG. 1 is a perspective structural schematic diagram of an overall structure of a filter antenna device provided by the present invention.

In the drawing, 1—antenna unit, 3—feed structure, 21—first resonant cavity, 22—second resonant cavity, 31—coplanar waveguide, 41—patch layer, 42—first metal layer, 43—second metal layer, 44—third metal layer, 51—first dielectric substrate, 52—second dielectric substrate, 53—third dielectric substrate, 61—first through hole, 62—second through hole, 63—third through hole, 71—metal probe, 81—coupling gap, 91—first metallized through hole, 92—second metallized through hole.

DESCRIPTION OF EMBODIMENTS

The present invention will be further illustrated with reference to the accompanying drawings and the embodiments.

Figure 2:
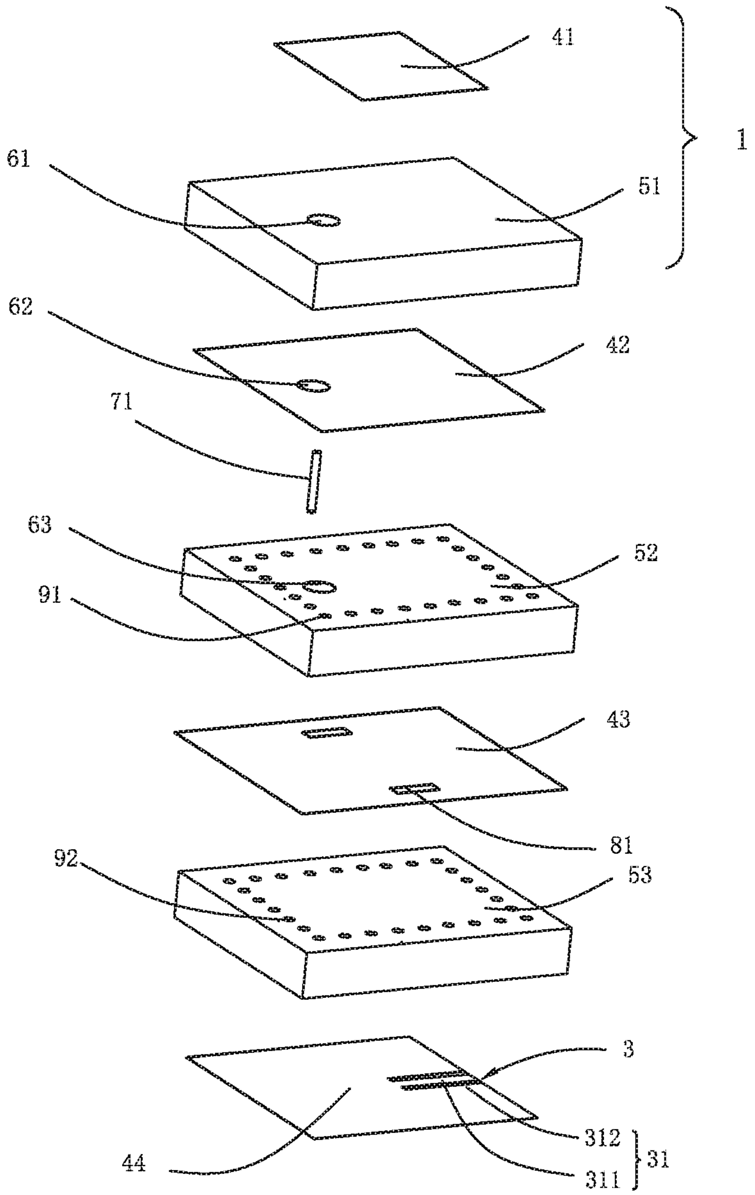
FIG. 2 is an exploded structural schematic diagram of a partial structure of a filter antenna device provided by the present invention.
Figure 3:
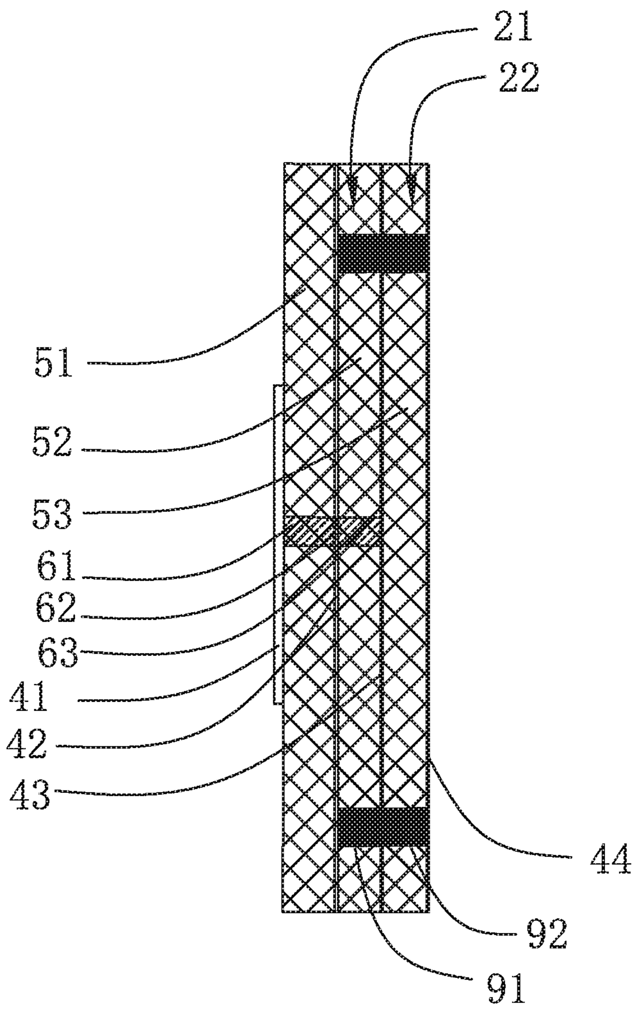
FIG. 3 is a cross-sectional diagram of a filter antenna device shown in FIG. 1 taken along line A-A.

As shown in FIG. 1 to FIG. 3, an embodiment provides a filter antenna, including a first resonant cavity 21 and a second resonant cavity 22 which are stacked from top to bottom and in coupling communication, an antenna unit 1 provided on a side of the first resonant cavity 21 facing away from the second resonant cavity 22, and a feed structure 3 provided in the second resonant cavity 22.

It should be noted that "stacked from top to bottom" in the context refers to a positional relationship in FIG. 1 of the present invention. If a placement state of the filter antenna changes, then the plurality of antenna units, the plurality of resonant cavities, the radiation structure and a filter structure are no longer stacked from top to bottom.

Different types of antennas can be selected as the antenna unit 1 according to practical use, such as a microstrip patch antenna, a microstrip traveling wave antenna, a microstrip slot antenna, etc. In this embodiment, the microstrip patch antenna is used. A specific structure of the microstrip patch antenna can be selected according to practical use, for example, adopting a rectangular shape, a circular shape, a ring shape, a triangular shape, a fan shape, a serpentine shape, etc. In this embodiment, a square microstrip patch antenna is used.

The specific structure of the antenna unit 1 is as shown in FIG. 1, and it includes a patch layer 41 and a first dielectric substrate 51 that are sequentially arranged from top to bottom. Since the square microstrip patch antenna is used in the present embodiment, the shape of the first metal layer 41 is a square.

A specific structure of the resonant cavity includes: sequentially arranged from top to bottom, a first metal layer 42, a second dielectric substrate 52, a second metal layer 43, a third dielectric substrate 53, and a third metal layer 44. A periphery of the second dielectric substrate 52 is provided with a plurality of first metallized through holes 91 spaced apart from one another and electrically connecting the first metal layer 42 with the second metal layer 43. The first metal layer 42, the second dielectric substrate 52, the second metal layer 43 and the first metallized through holes 91 together define a first resonant cavity 21. A periphery of the third dielectric substrate 53 is provided with a plurality of second metallized through holes 92 spaced apart from one another and electrically connecting the second metal layer 43 with the third metal layer 44. The second metal layer 43, the third dielectric substrate 53, the third metal layer 44, and the second metallized through holes 92 together define a second resonant cavity 22.

The second metal layer 43 is provided with coupling gaps 81, and the first resonant cavity 21 and the second resonant cavity 22 are in coupling communication with each other through the coupling gaps 81. A shape of the coupling gaps can be specifically selected according to practical application requirements, and a rectangle, a circle, a trapezoid, etc. can be adopted. In an embodiment, the first coupling gaps 81 are rectangular coupling gaps, and are located on two sides of the second metal layer 43.

The filter antenna further includes a metal probe 71 connecting the antenna unit 1 with the second metal layer 43. The metal probe 71 realizes electrical connection between the second metal layer 43 and the patch layer 41.

In an embodiment, the first dielectric substrate 51 is provided with a first through hole 61, the first metal layer 42 is provided with a second through hole 62, and the second dielectric substrate 52 is provided with a third through hole 63, for use in conjunction with the metal probe 71. That is, the metal probe 71 passes through the first through hole 61, the second through hole 62, and the third through hole 62 to connect the patch layer 41 with the second metal layer 43.

In an embodiment, a feed structure 3 is further included, and the feed structure is a coplanar waveguide 31 provided on the third metal layer 44. The coplanar waveguide 31 includes a central metal conduction band 311 and two side grounding conduction bands 312. In practical use, different feed structures, such as microstrip feeder lines, coaxial feeder lines, etc., may be selected depending on the use, which is not limited to the coplanar waveguide.

In an embodiment, the first dielectric substrate 51, the second dielectric substrate 52, and the third dielectric substrate 53 constitute LTCC dielectric block. The antenna unit 1, the first metal layer 42, the second metal layer 43 and the third metal layer 44 are formed on the LTCC dielectric block.

Figure 4:
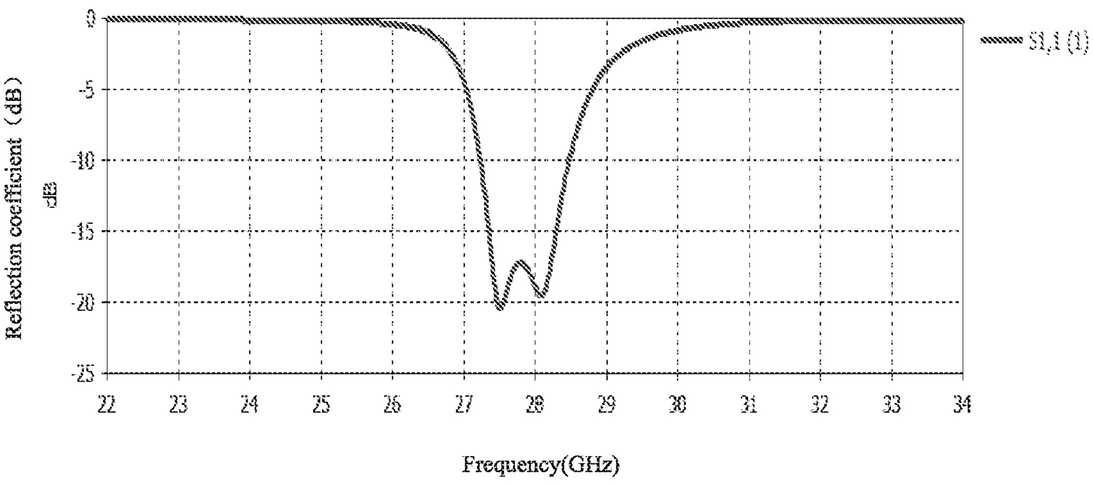
FIG. 4 illustrates a reflection coefficient graph of a filter antenna device provided by the present invention.
Figure 5:
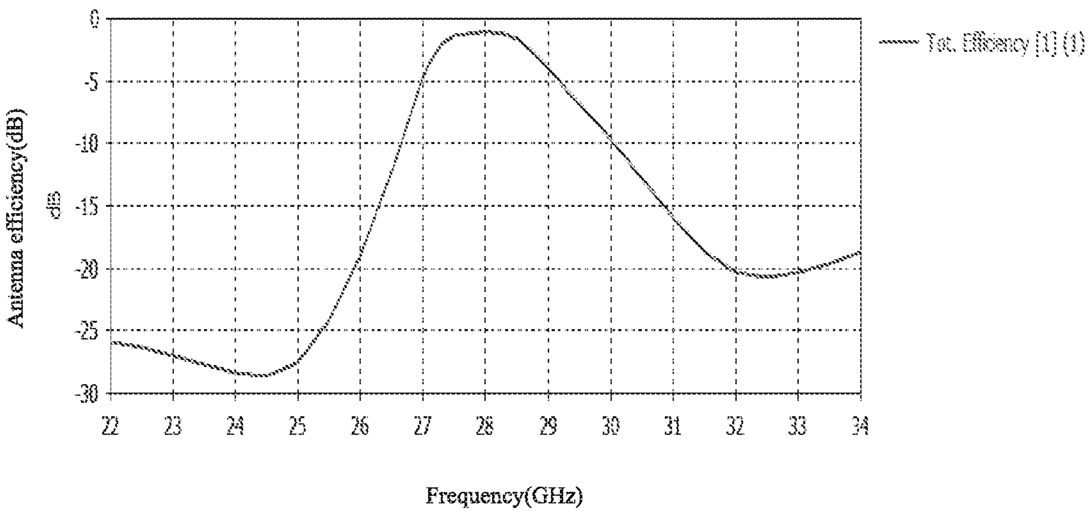
FIG. 5 illustrates an overall efficiency graph of a filter antenna device provided by the present invention.
Figure 6:
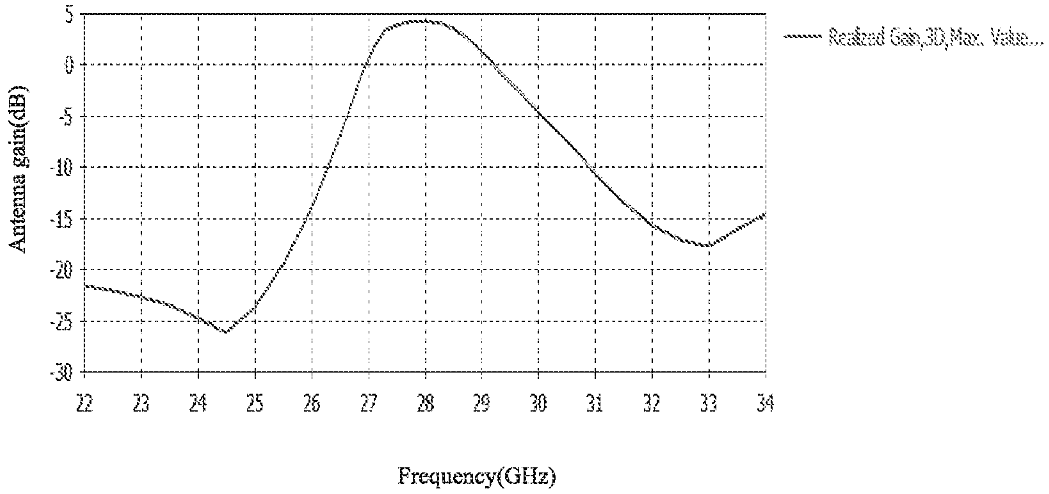
FIG. 6 illustrates a gain graph of a filter antenna device provided by the present invention.

FIGS. 4-6 illustrate performance simulation graphs of the filter antenna provided in the present invention. FIG. 4 illustrates a reflection performance simulation graph of the filter antenna. FIG. 5 illustrates an efficiency performance simulation graph of the filter antenna. FIG. 6 illustrates a gain performance simulation graph of the filter antenna. It can be seen that the filter antenna proposed by the present invention has an antenna return loss of smaller than 10 dB (a reflection coefficient is smaller than −10 dB) and an out-of-band rejection not smaller than 20 dB, such that interference of out-of-band spurious signals is effectively suppressed, and the antenna performance is improved. In summary, the filter antenna proposed by the present invention achieves a miniaturization design of the antenna while improving the performance of the antenna.

The above are merely embodiments of the present invention, and it should be noted herein that those skilled in the art can make variations and improvements without departing from the inventive concept of the present invention, but these are all within the protection scope of the present invention.

What is claimed is:

1. A filter antenna, comprising:

a first resonant cavity and a second resonant cavity that are stacked from top to bottom and in coupling communication with each other;

an antenna unit provided on a side of the first resonant cavity facing away from the second resonant cavity; and a feed structure provided in the second resonant cavity;

wherein the filter antenna comprises a first metal layer, a second metal layer, and a third metal layer that are sequentially stacked; the filter antenna further comprises first metallized through holes arranged adjacent to peripheries of the first metal layer and the second metal layer and electrically connecting the first metal layer with the second metal layer, and second metallized through holes arranged adjacent to peripheries of the second metal layer and the third metal layer and electrically connecting the second metal layer with the third metal layer; the first metal layer, the first metallized through holes and the second metal layer define the first resonant cavity; and the second metal layer, the second metallized through holes and the third metal layer define the second resonant cavity.

2. The filter antenna as described in claim 1, wherein the antenna unit is a microstrip patch antenna.

3. The filter antenna as described in claim 1, further comprising a metal probe connecting the antenna unit with the second metal layer.

4. The filter antenna as described in claim 1, wherein the second metal layer is provided with one or more coupling gaps to communicate the first resonant cavity with the second resonant cavity in a coupling manner.

5. The filter antenna as described in claim 4, wherein the one or more coupling gaps comprise two coupling gaps arranged at two opposite ends of the second metal layer, respectively.

6. The filter antenna as described in claim 1, wherein the feed structure is a coplanar waveguide provided on the third metal layer.

7. The filter antenna as described in claim 1, further comprising an Low Temperature Cofired Ceramic LTCC dielectric block, and the antenna unit, the first metal layer, the second metal layer, and the third metal layer are formed on the LTCC dielectric block.

* * * * *